United States Patent [19]
de Wit

[11] Patent Number: 5,448,103
[45] Date of Patent: Sep. 5, 1995

[54] TEMPERATURE INDEPENDENT RESISTOR

[75] Inventor: Michiel de Wit, Dallas, Tex.

[73] Assignee: Texas Instruments Incorporated, Dallas, Tex.

[21] Appl. No.: 228,068

[22] Filed: Apr. 15, 1994

Related U.S. Application Data

[62] Division of Ser. No. 885,700, May 19, 1992, abandoned.

[51] Int. Cl.$^6$ ............................................. H01L 27/02
[52] U.S. Cl. ................................. 257/536; 257/537; 257/538; 257/379; 257/467; 338/225 D
[58] Field of Search ............... 257/467, 536, 537, 538, 257/379, 380; 338/7, 8, 9, 22 SD, 25

[56] References Cited

U.S. PATENT DOCUMENTS

| | | | |
|---|---|---|---|
| 4,229,753 | 10/1980 | Bergeron et al. | 357/28 |
| 4,464,646 | 8/1984 | Burger et al. | 338/25 |
| 5,187,559 | 2/1993 | Isobe | 257/538 |

FOREIGN PATENT DOCUMENTS

| | | | |
|---|---|---|---|
| 58-18955 | 2/1983 | Japan | 257/538 |
| 0225648 | 12/1983 | Japan | 437/918 |
| 59-29447 | 2/1984 | Japan | 257/536 |
| 63-52468 | 3/1988 | Japan | 257/538 |
| 63-73550 | 4/1988 | Japan | 257/538 |
| 0268462 | 11/1990 | Japan | 437/918 |
| 3101160 | 4/1991 | Japan | 257/537 |
| 3-166757 | 7/1991 | Japan | 257/538 |

*Primary Examiner*—William Mintel
*Assistant Examiner*—Minhloan Tran
*Attorney, Agent, or Firm*—Ira S. Matsil; James C. Kesterson; Richard L. Donaldson

[57] ABSTRACT

A resistor circuit (and structure) 10 is disclosed herein. A first resistor 14 has a first temperature coefficient of resistance and is coupled to a second resistor 16 which has a second temperature coefficient of resistance, typically opposite to the first temperature coefficient of resistance. The resistors 14 and 16 are coupled together (e.g., in series or in parallel) to create a total resistor with a predetermined (e.g., substantially zero) temperature coefficient of resistance.

11 Claims, 7 Drawing Sheets

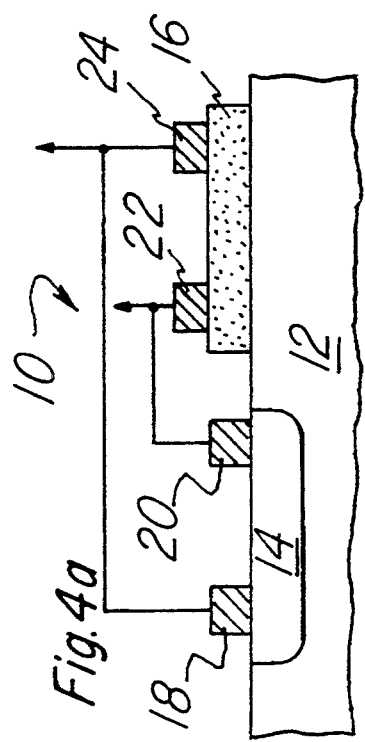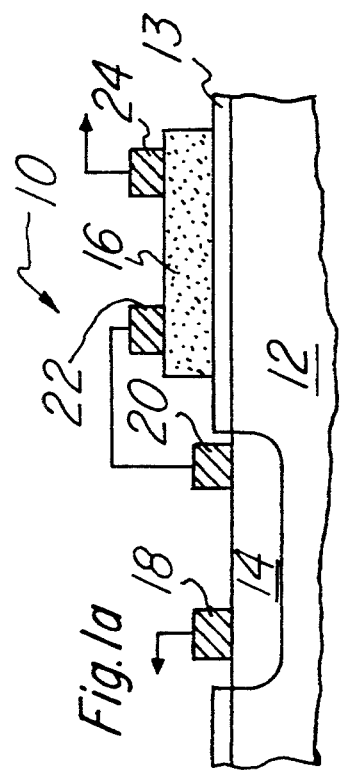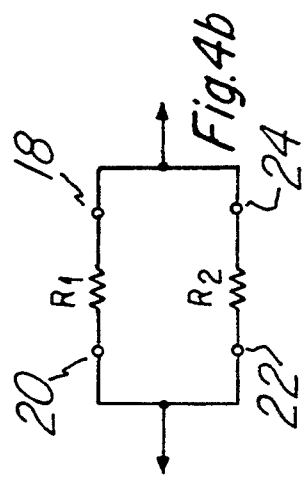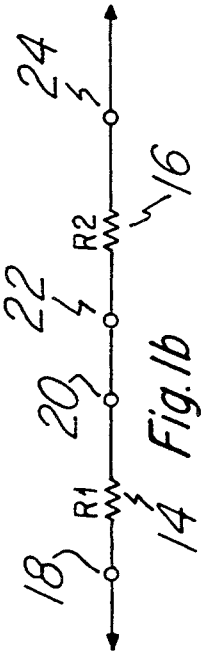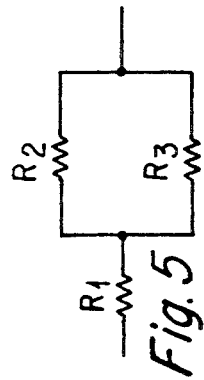

TEMPERATURE INDEPENDENT RESISTOR

This is a division, of application Ser. No. 07/885,700, filed May 19, 1992, now abandoned.

FIELD OF THE INVENTION

This invention generally relates to the fabrication of semiconductor devices and specifically to a temperature independent resistor and a method for forming the same.

BACKGROUND OF THE INVENTION

Many semiconductor devices and integrated circuits are designed to operate over wide temperature ranges. For example, circuits may be specified to perform correctly at all temperatures in a given temperature range. In some applications, this range may be rather large, for example from as low as −50° C. or lower up to 125° C. or possibly even higher.

In semiconductor physics, the mobility is a measure of the ease of carrier motion within a semiconductor structure. A low mobility implies the carriers inside the semiconductor are suffering a relatively large number of motion-impeding collisions. A large mobility, on the other hand, implies the carriers are zipping along with comparative ease. The resistivity of a structure or material is a measure of the material's inherent resistance to current transport. As is known, the resistivity is inversely proportional to the mobility. In other words, as the mobility goes up, the resistivity will go down; and as the mobility goes down, the resistivity will go up.

The mobilities and resistivities of semiconductor structures will depend upon the temperature, doping concentrations and other factors. In very low doped samples, for example, carrier mobilities monotonically decrease as the temperature is increased. For higher sample dopings, however, the temperature dependence becomes increasingly more complex.

SUMMARY OF THE INVENTION

Other objects and advantages will be obvious, and will in part appear hereinafter and will be accomplished by the present invention which provides a method and structure for temperature independent resistor.

A resistor circuit is disclosed herein. A first resistor has a first temperature coefficient of resistance and is coupled to a second resistor which has a second temperature coefficient of resistance, typically opposite to the first temperature coefficient of resistance. The resistors are coupled together (e.g., in series or in parallel) to create a total resistor with a predetermined (e.g., substantially zero) temperature coefficient of resistance. In a preferred embodiment, the first resistor comprises a n-doped well region formed in a semiconductor layer and the second resistor comprises a polycrystalline (or amorphous) semiconductor layer formed adjacent to the well region.

In one application, a clock generator circuit with a frequency substantially independent of temperature (e.g., a frequency change of less than 15% or 20%) can be formed. An oscillator circuit is coupled to a temperature independent resistor. The resistor includes a first resistor having a first temperature coefficient of resistance and a second resistor having a second temperature coefficient of resistance as described hereinabove. A capacitor is coupled between the temperature independent resistor and a reference node. The clock frequency of the clock generator will depend on the resistor and capacitor RC time constant.

One advantage of the present invention is that it provides a simple and relatively inexpensive method to produce substantially temperature independent resistors. Alternatively, resistors of desired temperature dependence can be fabricated.

Another advantage of the present invention is that it utilizes well-known semiconductor fabrication processes. No new equipment is needed to form the structures described herein. Further, the process and structure are flexible and can be used in a variety of configurations.

BRIEF DESCRIPTION OF THE DRAWINGS

The above features of the present invention will be more clearly understood from consideration of the following descriptions in connection with accompanying drawings in which:

FIG. 1a a cross-sectional view of a preferred embodiment resistor structure;

FIG. 1b a schematic diagram of the structure of FIG. 1a;

FIG. 4a is a cross-sectional view of a second preferred embodiment resistor structure;

FIG. 4b is a schematic diagram of the structure of FIG. 3a;

FIG. 5 is shematic diagram of one multiple resistor embodiment;

Corresponding numerals and symbols in the different figures refer to corresponding parts unless otherwise indicated.

DETAILED DESCRIPTION OF PREFERRED EMBODIMENTS

Figure 2:
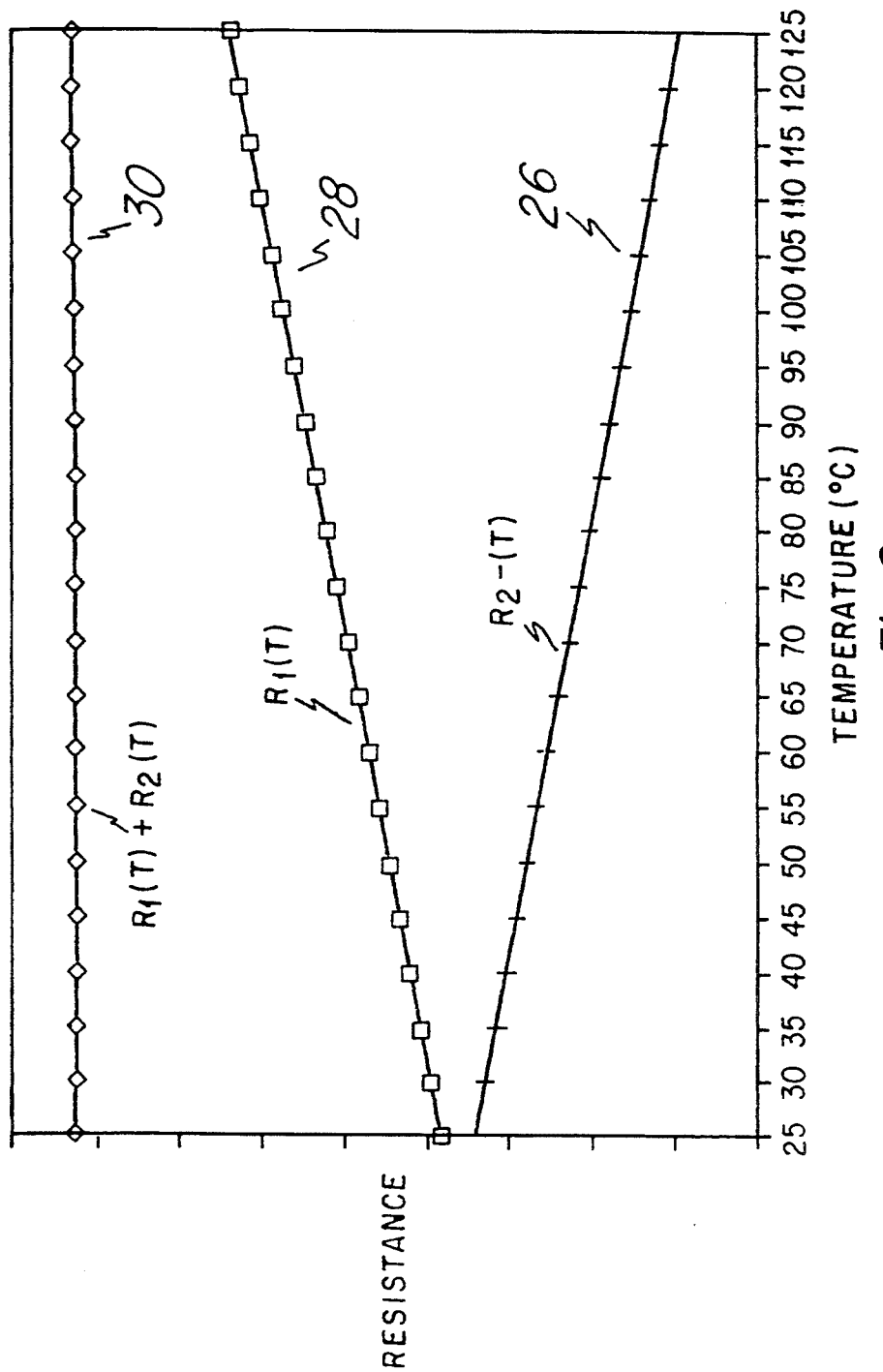
FIG. 2 is plot illustrating the total resistance for two resistors according to the present invention coupled in series.

The making and use of the presently preferred embodiments are discussed below in detail. However, it should be appreciated that the present invention provides many applicable inventive concepts which can be embodied in a wide variety of specific contexts. The specific embodiments discussed are merely illustrative of specific ways to make and use the invention, and do not delimit the scope of the invention.

The following is a description of the apparatus and method of the present invention. The preferred embodiment will be described first followed by a description of modifications. The method of using the invention will then be described.

Referring first to FIG. 1a, a preferred embodiment resistor structure 10 is illustrated. A substrate 12 is provided. The substrate 12 may be a semiconductor, for example silicon, substrate or may be a semiconductor layer, e.g., epitaxially grown or otherwise deposited, formed on another semiconductor layer (not shown) or on an insulating layer (not shown).

A well region 14 is formed in the semiconductor substrate 12. In one example, the well region 14 comprises a n-doped well formed in a p-type substrate 12.

The doped well region 14 may be formed by any of a number of doping methods including diffusion or ion implantation. If the well region 14 comprises an n-well, the dopant impurities may be arsenic, phosphorus or antimony, as examples.

A polycrystalline or amorphous semiconductor region 16 is formed on the surface of substrate 12 adjacent the well region 14. The polycrystalline region 16 is formed on an insulating layer 13 which is between the region 16 and the substrate 12. The insulating layer may be an oxide such as silicon dioxide or a nitride such as silicon nitride. In the preferred embodiment, the region 16 comprises a n-doped polycrystalline (or amorphous) silicon, hereinafter referred to as polysilicon. The polysilicon layer 16 may be formed by chemical vapor deposition or other means.

A first contact 18 is formed on the well region 14. The contact 18 will electrically connect the region 14 to other circuitry (not shown) on the chip, through a conductive interconnect (not shown). A second contact 20 is also formed on the well region 14. The second contact 20 formed part of the connection to layer 16. A third contact 22 is electrically connected to region 16. Contacts 20 and 22 are electrically coupled, for example through a metal interconnect. The fourth contact 24 is formed on region 16 to electrically couple, through an interconnect, the region 16 to other circuitry on the chip. The contacts and interconnects may be formed from any interconnect material including metals such as aluminum or copper or silicides such as titanium silicide or tungsten silicide.

The doped well region 14 and polysilicon layer 16 are formed to have a desired resistance and more specifically to have a resistance which has a desired response over temperature. The circuit for the two resistors in series is illustrated in FIG. 1b. The overall resistance of either resistor 14 (or 16) can be varied by moving the contacts 18 and/or 20 (or 22 and/or 24) closer together or farther apart.

In the preferred embodiment, the well region 14 comprises an n-well; and the region 16 comprise a n-doped polysilicon layer. The n-well region 14 has a positive temperature coefficient of resistivity. In other words, as the temperature of the n-well region is increased, the resistance $R_1$ will increase. On the other hand, the polysilicon layer 16 has a negative temperature coefficient of resistivity or the resistance $R_2$ will decrease as the temperature of the region 16 increases. When the two resistances $R_1$ and $R_2$ are coupled in series, a temperature independent resistor can be formed.

FIG. 2 illustrates a graphical representation of one concept of the present invention. An arbitrary temperature range from 25° to 125° C. is illustrated. It is assumed that the resistances $R_1$ and $R_2$ are linear functions of temperature. It is noted that the graph shown in FIG. 2 is illustrative and is not derived from actual measured data.

The resistance $R_1$ of the n-well region 14 is illustrated by the line 28, and the resistance $R_2$ of the polysilicon layer 16 is illustrated by the line 26. The line 30 shows the sum of the two resistance $R_1$ and $R_2$ and is substantially constant over temperature.

Figure 3A:
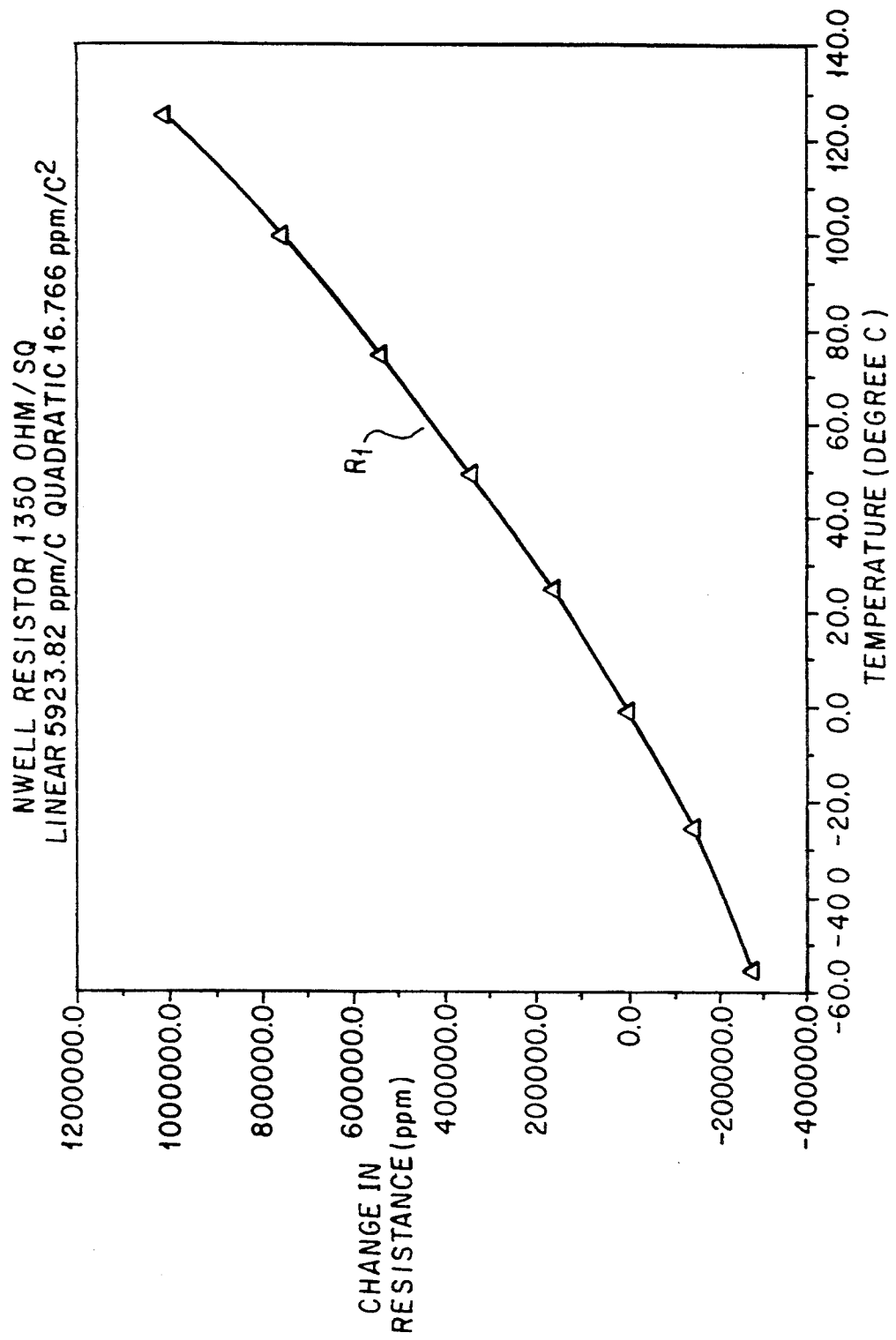
FIGS. 3a and 3b are plots of resistance over temperature for two exemplary resistors.
Figure 3B:
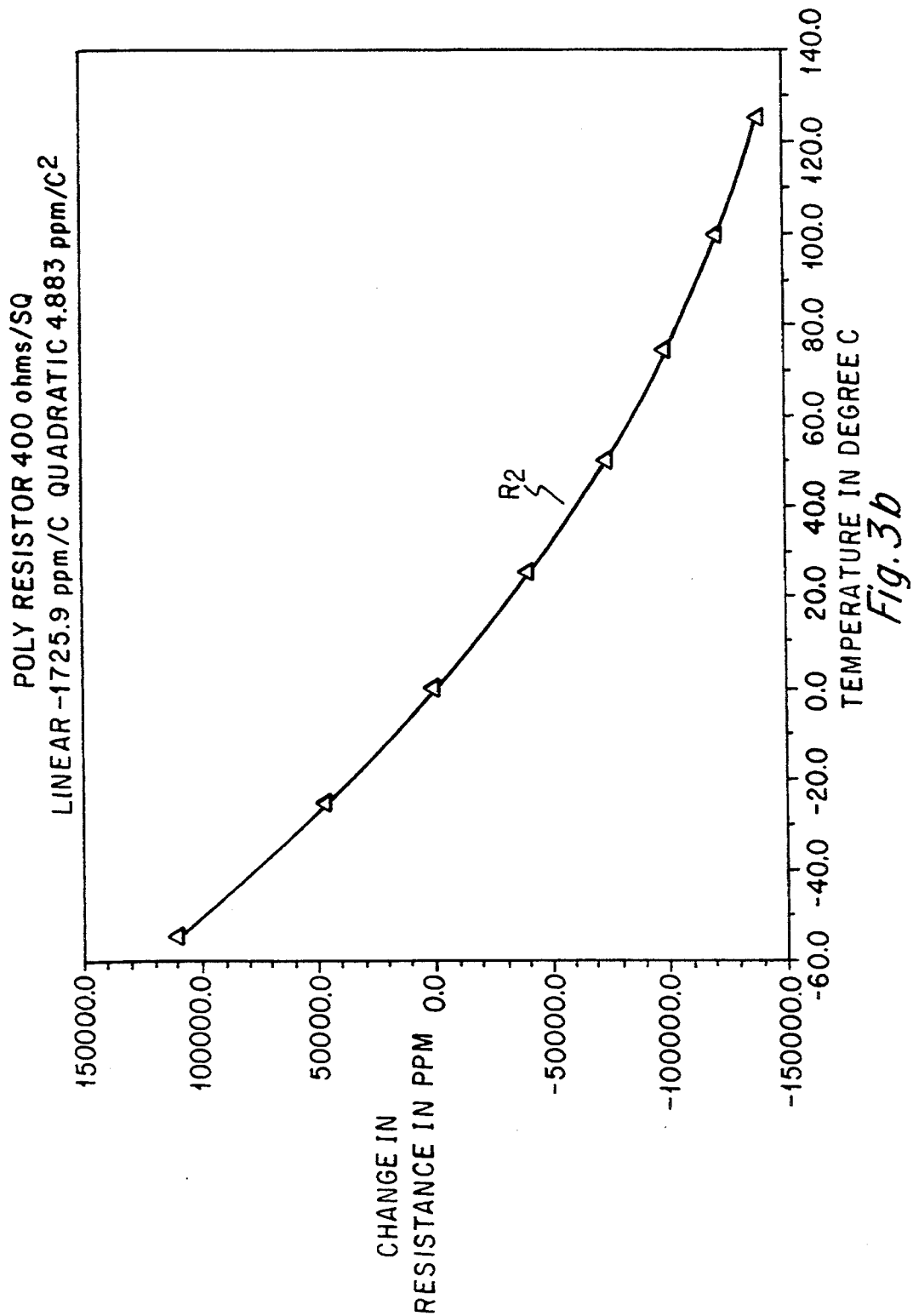

FIGS. 3a and 3b illustrate more realistic plots of change in resistance over temperature. Specifically, FIG. 3a represents an n-well resistor with a positive temperature coefficient of resistance and FIG. 3b represents a polysilicon resistor with a negative coefficient of resistance.

The total resistance $R_1+R_2$ can be determined by considering that in general a resistor has resistance
$$R = R_0(1 + a_1 T + a_2 T^2 + \ldots).$$

For the n-well resistor illustrated in FIG. 3a, $R_0$ is equal to 1350 Ω/square, $a_1$ is equal to 5923.82 ppm/° C. and $a_2$ is equal to 16.766 ppm/° C.$^2$. Likewise, for the polysilicon resistor illustrated in FIG. 3b, $R_0$ is equal to 400 Ω/square, $a_1$ is equal to $-1725.9$ ppm/°C. and $a_2$ is equal to 4.883 ppm/°C.$^2$.

In general, for any two resistors $R_1$ and $R_2$, the total resistance (ignoring any high order effects, i.e., $a_n=0$ for $n>1$)

$$R = R_1 + R_2$$

$$R = R_1(1+aT) + R_2(1+bT)$$

$$R = R_1 + R_2 + (R_1 a + R_2 b)T.$$

From the last equation, it can be seen that if $R_1 a + R_2 b$ is set equal to zero, all linear temperature dependence of the series resistance $R_1+R_2$ would be eliminated.

The general concept can be expanded beyond an n-well resistor and a polysilicon resistor. In fact, the two (or more) resistors do not even need to be formed on the same chip, i.e., monolithically. Hybrid resistors can also be used. In general, any two (or more) resistors which have different dependencies on temperature can be used.

In addition, the preceding discussions assume that the design goal requires a resistance which does not vary with temperature. In general, most any dependence can be designed for if the appropriate individual resistors are available.

Further, the resistors 14 and 16 may be coupled in parallel as illustrated in FIGS. 4a and 4b. In general, any configuration can be used to tailor the end resistance and temperature dependence to the desired goal.

Although described herein with only two resistors, more than two resistors may be included in various configurations. One such configuration is illustrated in FIG. 5.

Figure 6A:
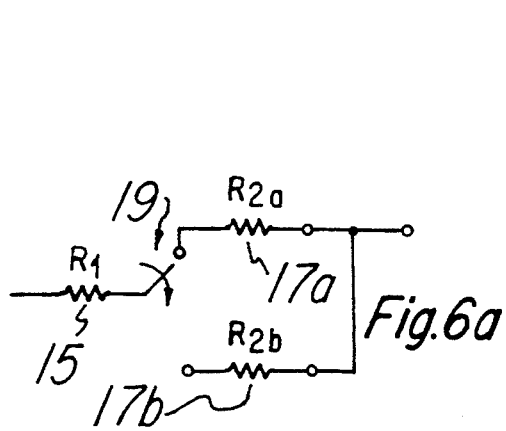
FIGS. 6a and 6b are schematic diagrams of a variation of the present invention.
Figure 6B:
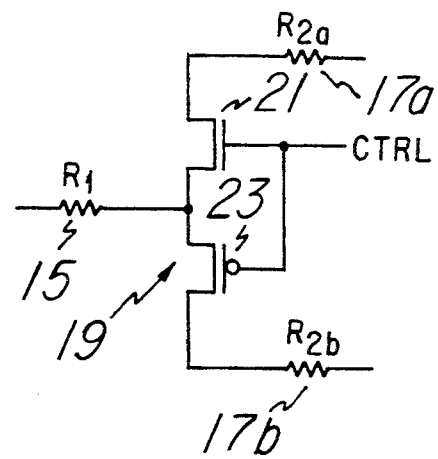

Other variations and modifications can also be utilized. For example, if a circuit requires multiple resistance functions with temperature, a switch 19 may be included as illustrated in FIG. 6a. A specific switch 19, a CMOS switch is illustrated in FIG. 6b. When the control signal CTRL is high (i.e., has a potential greater than the threshold of the n-channel device 21), the total resistance will be equal to $R_1+R_{2a}$. On the other hand, when the control signal CTRL is low (i.e., has a potential less than the threshold of the p-channel device 23), the total resistance will be equal to $R_1+R_{2b}$. The temperature coefficient of resistance for the total resistance will then vary for different resistances $R_{2a}$ and $R_{2b}$. Of course, the resistance and temperature coefficient of resistance of the transistor switch 19 must also be accounted for in the total resistance.

Figure 7:
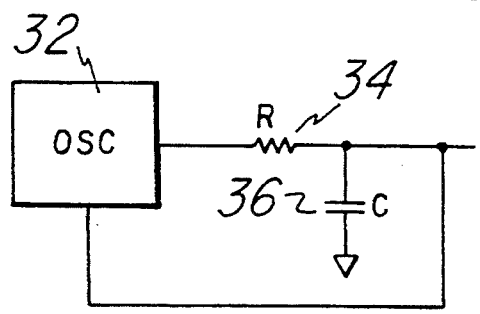
FIGS. 7(a) and 9(b) illustrate in varying detail, an application of the resistor of the present application, specifically a clock generator circuit.

There are a number of applications which may utilize the temperature independent resistor of the present invention. One such application is illustrated in FIG. 7 which shows an oscillator circuit 32 and associated resistor 34 and capacitor 36. The resistor 34 and capacitor 36 RC time constant will determine the frequency of the oscillator circuit.

In n number of application, it is desired to control the frequency response of an oscillator circuit with temperature. Typically, the capacitance C of the capacitor 36 is substantially constant with temperature and a resistor 34 as described herein could be used.

Figure 8:
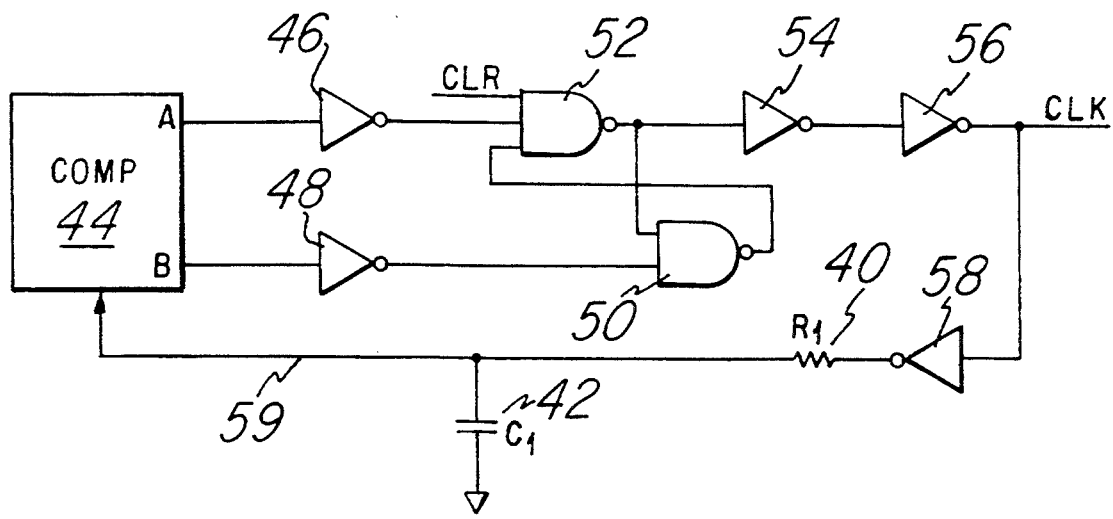

A more detailed clock circuit 38 is illustrated in FIG. 8. A comparator circuit 44 provides a logic high signal at output A when input 59 exceeds a high threshold and a logic high signal B when input 59 falls below a low threshold. One output of comparator circuit 44 is coupled to the input of inverter 46 and another output of comparator circuit 44 is coupled to the input of inverter 48. The output of inverter 48 is coupled to one input of NAND gate 50. The output of NAND gate 50 is coupled to one input of NAND gate 52 and the output of inverter 46 is coupled to a second input of NAND gate 52. A clear signal CLR is coupled to a third input of NAND gate 52. The output of NAND gate 52 is coupled to a second input of NAND gate 50 and also to the input of inverter 54. The output of inverter 54 is coupled to the input of inverter 56. The output of inverter 56 serves as the clock circuit output CLK and is also feed back to the oscillator circuit 44 through inverter 58 and resistor 40.

Figure 9A:
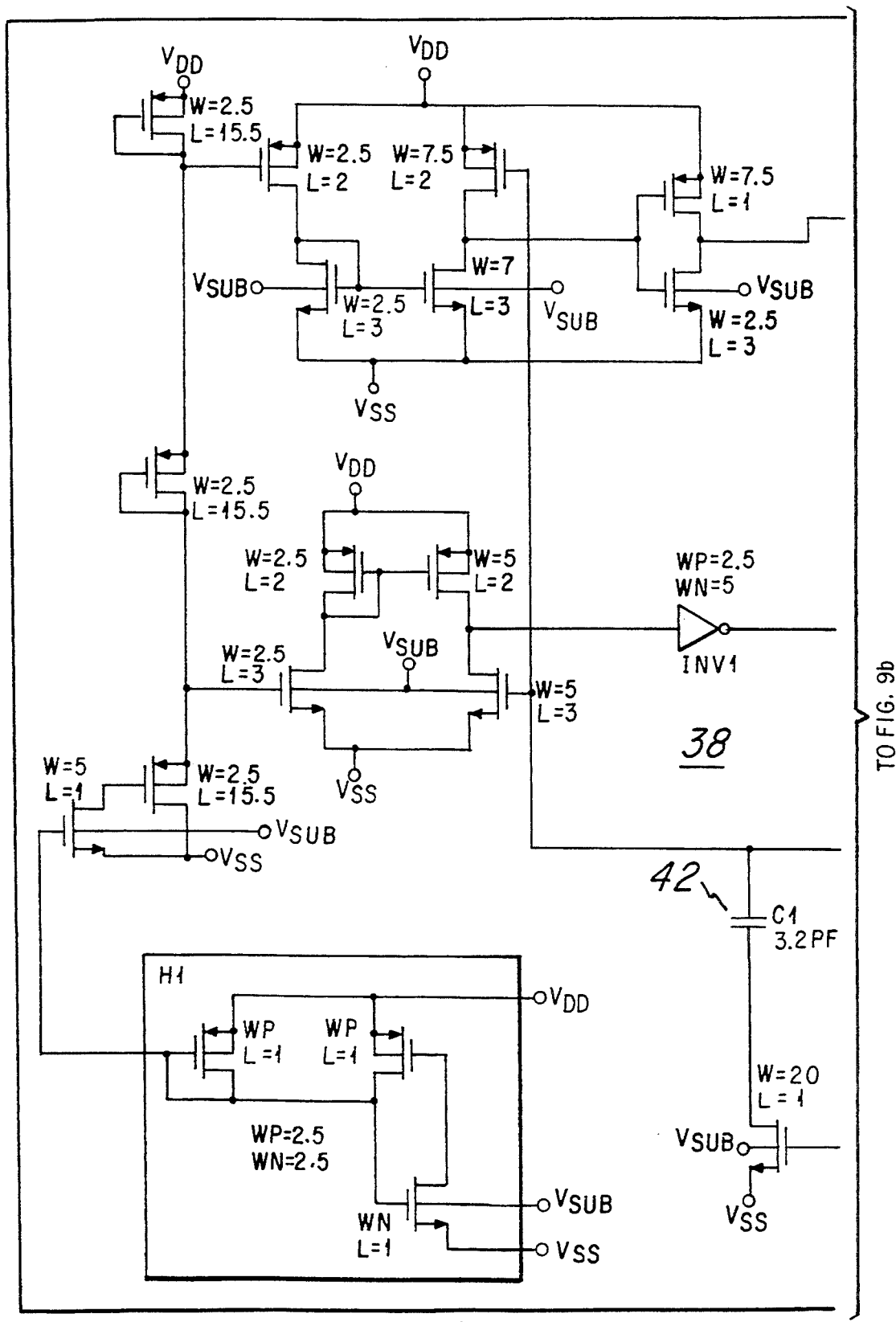
Figure 9B:
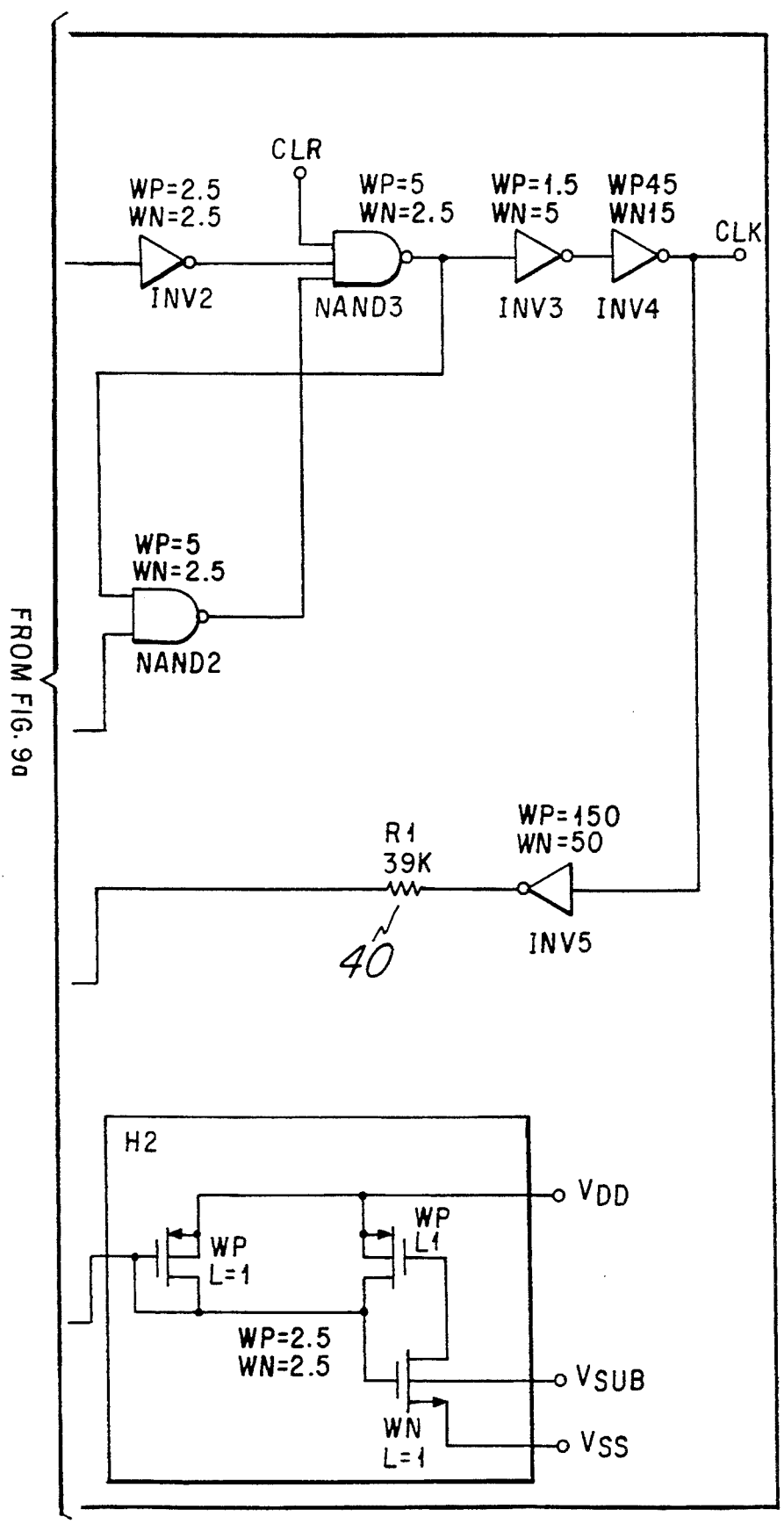

The oscillator frequency is set by the time constant $R_1C_1$ of resistor 40 and 15 capacitor 42. If the resistor 40 comprises a temperature independent resistor as described herein, the frequency will be substantially constant over temperature. Alternatively, the resistor 40 can be modified such that the frequency varies in a predefined manner as a function of temperature. A more detailed circuit is illustrated in FIG. 9 which shows more detail of the specific transistors for one example clock generator circuit. This circuit was built and tested. Over the temperature range of about 25° C. to about 125° C., the clock frequency changed by about 15%. Using prior art resistors (i.e., not temperature compensated), the frequency could change by as much as 50% or more.

Although only a clock generator circuit has been illustrated herein, the resistor circuit of the present invention can be utilized in a great number of applications. For example, delay generators typically use a temperature independent RC circuit. In addition, the resistor circuit can be used to generate a voltage reference from a constant current source or a constant current from a constant voltage source. These are only two more examples of applications of the present invention.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A variable resistor circuit comprising:
   a first resistor having a first temperature coefficient of resistance;
   a second resistor having a second temperature coefficient of resistance;
   a third resistor having a third temperature coefficient of resistance different than said second temperature coefficient of resistance;
   a three-terminal switch which includes a first, a second and a third terminal, said three-terminal switch configured such that said first terminal is coupled to said first resistor, said second terminal is coupled to said second resistor and said third terminal is coupled to said third resistor, such that said first resistor is electrically coupled to said second resistor when said switch is in a first state and said first resistor is electrically coupled to said third resistor when said switch is in a second state.

2. The circuit of claim 1 wherein a resistor comprising said first and second resistors has a temperature coefficient of resistance which is substantially zero.

3. The circuit of claim 1 wherein said second resistor comprises a doped well region.

4. The circuit of claim 3 wherein said well region is doped with n-type impurities.

5. The circuit of claim 3 wherein said first resistor comprises a polysilicon resistor.

6. The circuit of claim 5 wherein said third resistor comprises a doped well region.

7. The circuit of claim 3 wherein said third resistor comprises a polysilicon resistor.

8. The circuit of claim 1 wherein said second resistor comprises a polysilicon resistor.

9. A variable resistor circuit comprising:
   a first resistor;
   a second resistor;
   a third resistor; and
   a switch with a first terminal coupled to said first resistor, a second terminal coupled to said second resistor and a third terminal coupled to said third resistor, such that said first resistor is electrically coupled to said second resistor when said switch is in a first state to form a first combined resistor which includes said first resistor and said second resistor and such that said first resistor is electrically coupled to said third resistor when said switch is in a second state to form a second combined resistor which includes said first resistor and said third resistor;
   wherein said first combined resistor has a first temperature coefficient of resistance and said second combined resistor has a second temperature coefficient of resistance, where said first temperature coefficient of resistance is different than said second temperature coefficient of resistance.

10. A variable resistor circuit comprising:
    a first resistor having a first terminal and a second terminal said, first resistor having a first temperature coefficient of resistance;
    a second resistor having a first terminal and a second terminal, said second resistor having a second temperature coefficient of resistance;
    a third resistor having a first terminal and a second terminal, said third resistor having a third temperature coefficient of resistance;
    an n-channel field effect transistor having a first source/drain region, a second source/drain region and a gate, wherein said first source/drain region is coupled to the first terminal of said second resistor and said second source/drain region is coupled to the first terminal of said first resistor; and
    a p-channel field effect transistor having a first source/drain region, a second source/drain region and a gate, wherein said first source/drain region is coupled to the first terminal of said third resistor and said second sourced drain region is coupled to the first terminal of said first resistor and said gate is coupled to said gate of said n-channel field effect transistor.

11. The circuit of claim 10 wherein said third temperature coefficient of resistance is different than said second temperature coefficient of resistance.

* * * * *